(12) United States Patent
Puma et al.

(10) Patent No.: US 7,283,002 B2
(45) Date of Patent: Oct. 16, 2007

(54) PHASE LOCKED LOOP WITH A MODULATOR

(75) Inventors: Giuseppe Li Puma, Bochum (DE); Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 312 days.

(21) Appl. No.: 11/145,822

(22) Filed: Jun. 6, 2005

(65) Prior Publication Data

US 2005/0280473 A1 Dec. 22, 2005

Related U.S. Application Data

(63) Continuation of application No. PCT/DE03/03949, filed on Dec. 1, 2003.

(30) Foreign Application Priority Data

Dec. 6, 2002 (DE) ................. 102 57 181

(51) Int. Cl.
*H03L 7/18* (2006.01)
(52) U.S. Cl. .......................... 331/16; 331/25
(58) Field of Classification Search ................ 331/1 A, 331/6, 18, 25; 327/156–159; 332/127; 360/51; 375/376; 455/260
See application file for complete search history.

(56) References Cited

U.S. PATENT DOCUMENTS 6,008,703 A 12/1999 Perrott et al.

| | | |
|---|---|---|
| 6,424,192 B1 | 7/2002 | Lee et al. |
| 6,943,598 B2 * | 9/2005 | Ghazali et al. ............. 327/147 |
| 2007/0041486 A1 * | 2/2007 | Shin ........................... 375/376 |

FOREIGN PATENT DOCUMENTS

| | | |
|---|---|---|
| GB | 2 252 879 A | 8/1992 |
| JP | 2001177404 A | 6/2001 |
| WO | WO 02/27936 A2 | 4/2002 |

OTHER PUBLICATIONS

"A 1.8 GHz CMOS Fractional-N Frequency Synthesizer with Randomized Multi-Phase VCO", Chun-Huat Heng and Band-Sup Song, IEEE Custom Integrated Circuits Conference, May 12-15, 2002, 5 pgs.

(Continued)

*Primary Examiner*—David Mis
(74) *Attorney, Agent, or Firm*—Eschweiler & Associates, LLC

(57) ABSTRACT

The invention provides a phase locked loop having a modulator which is based on a $\Sigma\Delta$ fractional N phase locked loop. In the forward path of the PLL, the output of the oscillator has an additional frequency divider which provides the output frequency of the PLL in a plurality of different phases. A multiplexer which is connected upstream of the multimodulus divider in the PLL's feedback path and which is actuated by the $\Sigma\Delta$ modulator, like the divider, selects the respective desired phase. This allows the minimum step size of the division factors to be reduced to values of less than 1 relative to the output frequency, which significantly reduces the quantization noise. The PLL bandwidth may therefore advantageously be the same size as the modulation bandwidth.

11 Claims, 2 Drawing Sheets

OTHER PUBLICATIONS

"A 27-nW CMOS Fractional-N Synthesizer Using Digital Compensation for 2.5-Mb/s GFSK Modulation", Michael H. Perrott, Theodore L. Tewksbury III and Charles G. Sodini, IEEE Journal of Solid-State Circuits, vol. 32, No. 12, Dec. 1997, pp. 2048-2060.

International Search Report, Int'l Application No. PCT/DE03/03949, Int'l Filing Date Dec. 1, 2003, 3 pgs.

U.S. Appl. No. 11/145,821, filed Jun. 6, 2005, Li Puma et al.

"Fractional-N Frequency Synthesizer for Wireless Communications", A.E. Hussein and M.I. Elmasry, IEEE International Symposium on Circuits and Systems, May 26-29, 2002, 5 pgs.

"A modeling Approach for $\Sigma$-$\Delta$ Fractional-N Frequency Synthesizers Allowing Straightforward Noise Analysis", Michael H. Perrott, Mitchell D. Trott and Charles G. Sodini, IEEE Jounral of Solid-State Circuits, vol. 37, No. 8, Aug. 2002, pp. 1028-1038.

"Digital Enhanced Cordless Telecommunications (DECT); Common Interface (CI); Part 2; Physical Layer (PHL)", ETSI EN 300 175-2 V1.5.1 (3001-02), 53 pgs.

International Search Report, Int'l Application No. PCT/DE03/03894, Int'l Filing Date Nov. 25, 2003, 2 pgs.

International Search Report, Int'l Application No. PCT/DE03/03949, Int'l Filing Date Dec. 1, 2003, 3 pgs.

"Digitale Verarbeitung Analoger Signale", S. D. Stearns, Oldenbourg Verlag, München, 1988, 5 pgs

* cited by examiner

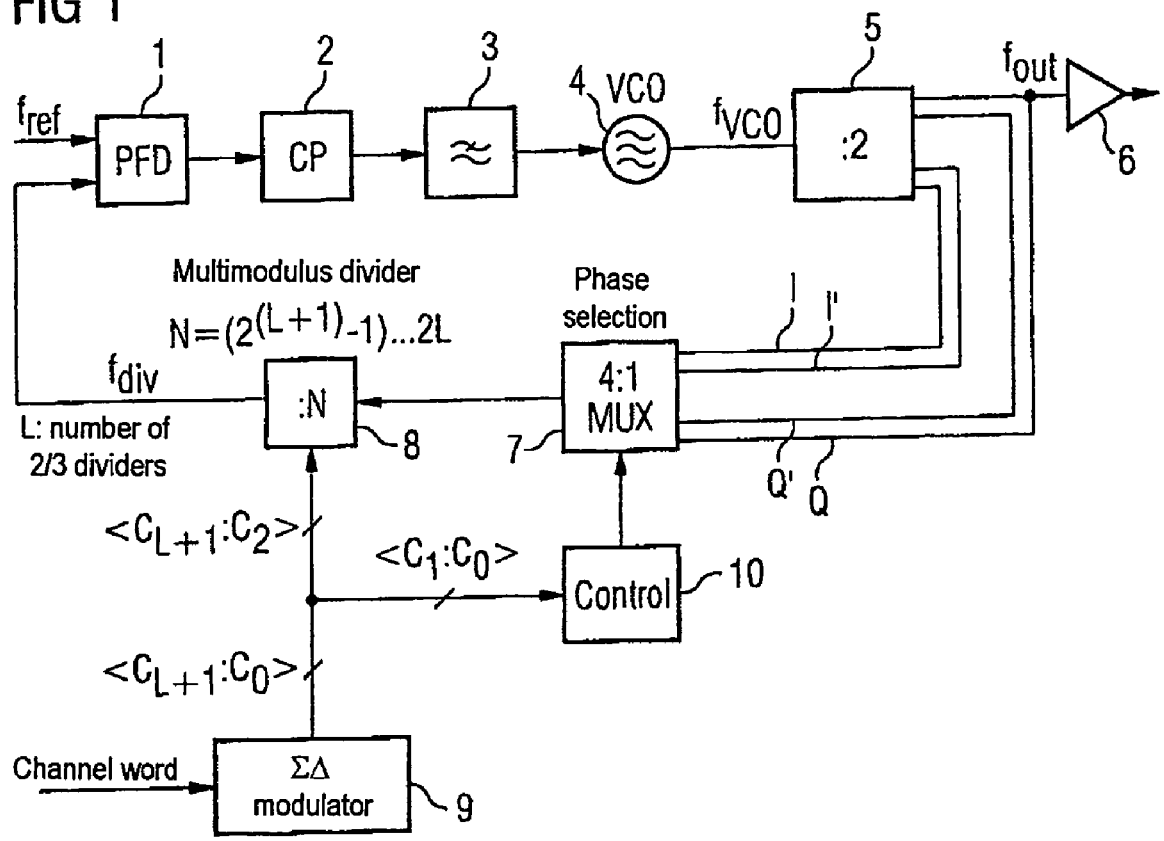
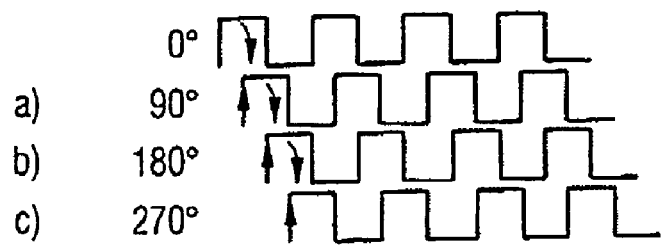
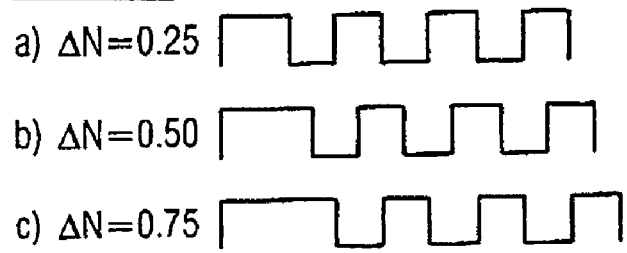

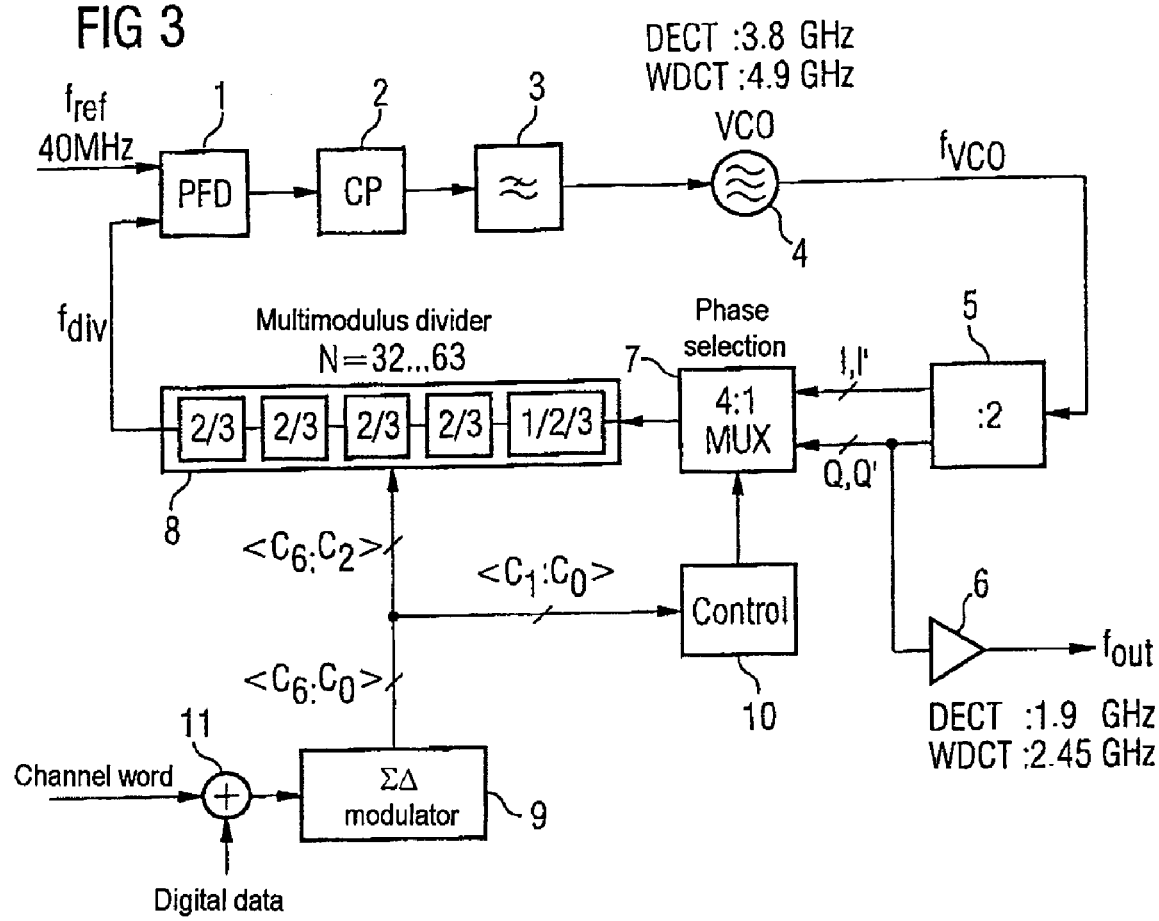
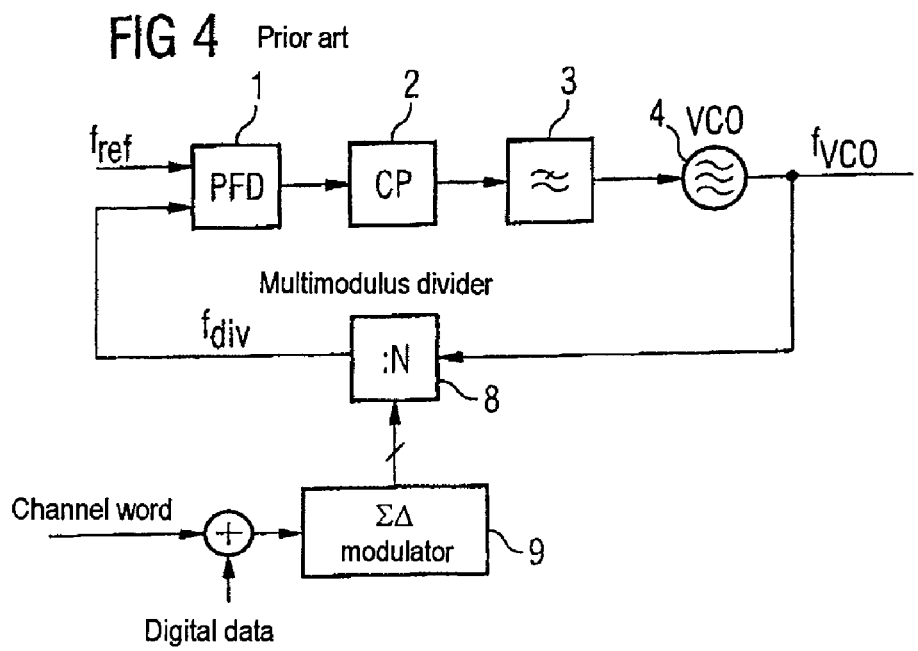

PHASE LOCKED LOOP WITH A MODULATOR

REFERENCE TO RELATED APPLICATIONS

This application is a continuation of PCT/DE03/03949, filed Dec. 1, 2003 which was not published in English, that claims the benefit of the priority date of German Patent Application No. DE 102 57 181.3, filed on Dec. 6, 2002, the contents of which both are herein incorporated by reference in their entireties.

FIELD OF THE INVENTION

The present invention relates to a phase locked loop with a modulator.

BACKGROUND OF THE INVENTION

Normally, alterable carrier frequencies for message transmission are generated using phase locked loops (PLLs).

Such a PLL circuit is shown using a block diagram in FIG. 4. In this case, a phase comparator 1 in a forward path actuates an oscillator 4. The actuation is effected via a charge pump circuit 2 and a low-pass filter 3. The phase comparator in a PLL is also called a phase detector or phase/frequency detector. A feedback path in the PLL contains a frequency divider 8 which divides down the frequency of the oscillator frequency $f_{vco}$. The phase comparator 1 compares the divided-down frequency $f_{vco}$ with a reference frequency $f_{ref}$. The desired output frequency $f_{vco}$ can be set in such an arrangement by altering the frequency division ratio in the feedback path.

For modern, digital radio systems, carrier frequency generation and digital frequency modulation can be performed using a development of the PLL described, which is called a $\Sigma\Delta$ fractional N PLL. In this case, as FIG. 4 shows, the divider 8 in the feedback path is in the form of a multimodulus divider which is actuated by a digital $\Sigma\Delta$ modulator 9. The desired frequency modulation takes place digitally in this case by varying the frequency division value of the multimodulus divider 8.

The prior art document U.S. Pat. No. 6,008,703 describes such a PLL with a $\Sigma\Delta$ modulator. The PLL indicated therein comprises, in the forward path, a phase/frequency detector which uses a loop filter to actuate a voltage-controlled oscillator. The feedback path contains a multimodulus divider which is actuated by a digital $\Sigma\Delta$ modulator. The $\Sigma\Delta$ modulator, in turn, is supplied firstly with information about the desired carrier frequency and secondly with conditioned and filtered digital modulation data.

When stipulating the dimensions of or designing such a phase locked loop, the choice of bandwidth for the phase locked loop is of particularly great importance. In this context, it is necessary to find a compromise between noise properties and modulation bandwidth. On the one hand, the noise needs to be as low as possible, for example in order to adhere to the spectral transmission masks prescribed in, for example various radio specifications. This requires the selection of a relatively small loop bandwidth. On the other hand, this is opposed by the fact that transmitting modulated data requires a large bandwidth for modern applications in communication technology.

A system-related, dominant noise component is produced as a result of the quantization noise of the $\Sigma\Delta$ modulator itself. The $\Sigma\Delta$ modulator normally actuates the multimodulus divider and in so doing brings about random changeover between integer division ratios.

A multimodulus divider which, as in the prior art patent U.S. Pat. No. 6,008,703, comprises a series circuit containing a plurality of two/three frequency dividers affords a set of integer division values based on the specification $$N = N_o + \sum_{i=0}^{L-1} c_i \cdot 2^i$$

where L=number of two/three divider stages and $N_0=2^L$.

In this case, a two/three divider is understood to mean a frequency divider whose frequency division ratio can be changed over between the division values 2 and 3. The control lines which the modulator uses to actuate the multimodulus divider are in this case denoted by the range $C_{L-1}$ to $C_0$. In the case of the described prior art, the more or less random changeover of the division factor by the $\Sigma\Delta$ modulator when the division value is varied results in a minimum step size for the division factor of $\Delta N$ of 1. However, this more or less random changeover of the division factor also brings about a change in the frequency over time and therefore produces a "frequency or phase interference swing".

The $\Sigma\Delta$ modulator distributes the power of this quantization noise in line with its noise transfer function over the frequency band. The quantization noise is raised from low frequencies to higher frequencies as a result. This is also called residual FM jitter, or else phase noise. The magnitude of this interference swing determines the signal-to-noise ratio (SNR) of the frequency-modulated or phase-modulated carrier signal and therefore has a significant effect on the system properties of such a transmitter, such as its adjacent channel interference.

Difficulties may also arise as a result of the aforementioned demanded adherence to a spectral transmission mask in practically all telecommunication standards.

The aforementioned prior art patent U.S. Pat. No. 6,008,703 attempts to solve the problems described by designing the bandwidth of the control loop to be significantly smaller than is actually required for transmitting the modulated data. To compensate for the resultant frequency response of the loop filter, the data to be modulated are first of all subjected to digital precompensation using a filter before being fed into the $\Sigma\Delta$ modulator. This involves high frequency components being raised digitally. A fundamental drawback of this solution is its required, highly accurate alignment between the digital filter for compensation and the analog loop filter.

By way of example, the analog loop filter is subject to temperature drift effects, ageing influences, manufacturing tolerances etc. If these alter the bandwidth of the control loop, the digital precompensation causes the higher frequency components to be raised too much or too little.

Another conventional option for compensating for the reduced loop bandwidth is provided by "two-point modulation". This involves the modulation data being fed into the phase locked loop at two different input points. This is normally done firstly via the frequency divider and secondly at the input of the controlled oscillator. In this case, the modulation point on the frequency divider has low-pass filter properties, while the analog modulation point at the oscillator input has high-pass filter properties. The overall result is therefore a constant transfer function for the modulation data. However, two-point modulation also has the problem of avoiding mismatches between the analog and digital signal paths. Worded conversely, two-point modulation has very high demands for matching between the analog and digital signal paths.

The prior art patent U.S. Pat. No. 6,424,192 B1 shows a fractional N PLL with a multiple feedback VCO to which a multiplexer is connected. This allows the reference frequency to be increased for the same channel allocation and therefore allows the phase noise of the VCO to be reduced.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to a phase locked loop with a modulator in which alignment problems between digital and analog circuit parts are avoided, thereby attaining a significant improvement in the noise properties.

The invention includes a phase locked loop with a modulator, the phase locked loop having a forward path, comprising a phase comparator with a first input for supplying a signal at a reference frequency and with a second input, and a controlled oscillator with a control input which is coupled to an output of the phase comparator. The forward path further comprises a frequency divider with a signal input which is connected to an output of the controlled oscillator, with an output which forms the signal output for tapping off a signal at an output frequency from the phase locked loop, and with at least three further outputs, designed for tapping off respective signals at the output frequency which are phase-shifted with respect to the signal output.

The phase locked loop includes a feedback path comprising a multiplexer with a plurality of inputs which are each associated with and connected to the outputs of the frequency divider, with an output and with at least one control input, and a multimodulus divider with an input which is connected to the output of the multiplexer, with an output which is connected to the second input of the phase comparator, and with at least one control input for preselecting the division ratio. The feedback path further comprises a control unit which is coupled to the control inputs of the multiplexer and of the multimodulus divider, the control unit being in the form of a sigma-delta modulator.

In accordance with the present invention, the quantization noise is reduced by virtue of the minimum divider step size $\Delta N$ being reduced. This step size is less than 1 in accordance with the invention, which means that the phase locked loop can change over with a step size which is smaller than the reference frequency supplied to the phase comparator. The reduction in the minimum divider step size to values of less than 1 is in this case relative to the output frequency of the phase locked loop.

Reducing the step size of the multimodulus divider results in the instantaneous frequency varying over a smaller frequency range. This in turn reduces the FM interference swing, since the entire quantization noise in the $\Sigma\Delta$ modulator is reduced by the factor of the divider step reduction.

To reduce the step size $\Delta N$, the invention involves the output frequency being output in different phases between which the feedback to the feedback path is changed over.

In accordance with the present invention, the bandwidth of the control loop may therefore advantageously be stipulated to be the same size as the modulation bandwidth. There is thus no need for either digital precompensation or two-point modulation. Accordingly, no mismatches arise as a result of drift effects in the analog part.

In accordance with one embodiment of the invention, the frequency divider provided in the forward path is a divide-by-two frequency divider which halves the oscillator frequency and outputs it as the output frequency from the control loop.

Accordingly, the controlled oscillator is designed such that it oscillates at twice the output frequency.

Divide-by-two frequency dividers can be implemented and integrated particularly precisely and with little complexity. By way of example, D-type flip-flops may be used as frequency halvers.

In accordance with a further embodiment of the present invention, the frequency divider has four outputs at which a total of four signals phase-shifted with respect to one another in steps of 90° are provided which each have the output frequency. The use of four signals with the phases 0°, 90°, 180° and 270° affords a divider step size $\Delta N$ of 0.25 relative to the output frequency. This reduces the FM interference swing by the factor 4. This corresponds to a spectral reduction in the phase noise of 12 dB.

In particularly advantageous fashion, a master-slave D-type flip-flop with feedback can be used to produce the four phase-shifted signals. Such a flip-flop provides four signals with the phases 0°, 90°, 180° and 270°.

As a generalization, instead of the step size $\Delta N$ of 0.25 it is also possible to attain any other step size meeting the specification $\Delta N=1{:}m$, where m is an integer, using the present invention. Accordingly, it is possible to set any step size which corresponds to the reciprocal of an integer. For this, frequency division is used to produce from the oscillator signal m signals with different phases and a step size relative to one another of 360° divided by the number m of signals.

If just a minimum step size $\Delta N$ of 0.5 is intended to be provided, the frequency divider in the forward path may be in the form of an inverter which produces the requisite phases of 0° and 180°.

For the multiplexer to be actuated by the control unit, which is a $\Sigma\Delta$ modulator, the two least significant bits which are output by the $\Sigma\Delta$ modulator may be used in one example. These are also called LSBs. Two bits suffice in order to be able to change over between the preferred four different-phase signals.

To couple the phase comparator to the oscillator, the forward path preferably contains a loop filter. In this case, in accordance with the present invention, the loop filter is preferably designed for a control bandwidth for the phase locked loop which is as large as the modulation bandwidth.

In the case of the present phase locked loop, the loop bandwidth is large enough for modulation using the sigma-delta modulator and/or the control unit to be possible.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using a plurality of exemplary embodiments with reference to the drawings, in which:

FIG. 1 is a block diagram illustrating an exemplary embodiment of an inventive phase locked loop with a modulator, FIG. 2 is a plurality of timing diagrams illustrating signal profiles for selected signals in a circuit as shown in FIG. 1, FIG. 3 is a block diagram illustrating a development of the circuit from FIG. 1 applied to a DECT or WDCT system, and FIG. 4 is a block diagram illustrating a ΣΔ PLL based on the prior art.

DETAILED DESCRIPTION OF THE INVENTION

FIG. 1 shows a phase locked loop with a phase comparator 1 having two inputs and an output. One of the two inputs of the phase detector 1 can have a reference frequency generator connected to it which delivers a reference frequency $f_{ref}$ (not shown here). The output of the phase detector 1 has a loop filter 3 connected to it via a charge pump circuit 2, said loop filter being in the form of a low-pass filter. The output of the loop filter 3 has the control input of a voltage-controlled oscillator 4 connected to it. The output of the voltage-controlled oscillator 4, at which a signal at an oscillator frequency $f_{vco}$ is provided, is connected to a frequency divider 5. The frequency divider 5 is, in one example, in the form of a master-slave D-type flip-flop with feedback and has four outputs. The four outputs of the frequency divider 2, which brings about frequency halving, are all designed for tapping off the output frequency $f_{out}$, which corresponds to half the oscillator frequency $f_{vco}$. The signals which can be tapped off at the four outputs of the frequency divider 5, however, have a respective phase offset from one another of 90°. One of the four outputs of the frequency divider 5, to which an output amplifier 6 is connected, forms the output of the phase locked loop.

The four outputs of the frequency divider 2 are connected to four inputs of a 4:1 multiplexer 7 which are respectively associated with them. The signals transmitted in this context, which are respectively phase-shifted through 90° relative to one another, are denoted by I, Q, I' and Q'. Between the signals I and I' there is a phase shift of 180°, while between the orthogonal components I and Q there is a phase shift of 90°. The output of the multiplexer 7 is connected to the input of a multimodulus divider 8 whose output is in turn coupled to a further input of the phase detector 1 for the purpose of transmitting a signal at a divided-down frequency $f_{div}$. The multiplexer 7 and the multimodulus divider 8 are actuated by a ΣΔ modulator 9, 10. For this, the ΣΔ modulator 9 has a multiplicity of control outputs, two of which are connected to a control unit 10 whose output is connected to the control input of the multiplexer 7. The control input of the multimodulus divider is connected to a number of control lines between the ΣΔ modulator 9 and the divider 8 which corresponds to the number of divider stages.

In the case of the proposed ΣΔ fractional N PLL, the oscillator 4 oscillates at twice the output frequency $f_{out}$. The oscillator is controlled by a comparison result for a reference frequency $f_{ref}$ and the divided-down frequency $f_{div}$ which is fed back. The particular feature of the present invention is first that an additional frequency divider is provided in the forward path of the phase locked loop, namely frequency divider 5. This provides the output frequency in four different phases, between which it is possible to select using the multiplexer 7. Relative to the output frequency $f_{out}$, the result is thus a step size ΔN<1 relative to the division ratio. In accordance with the PLL of the present invention, it is possible to change over not just in frequency steps which are prescribed by the reference frequency $f_{ref}$, which are 40 MHz in this example, but also in step sizes of 10 MHz in the present case, which are dependent on the factor 0.25.

The small step size means that the instantaneous frequency varies over a smaller frequency range, so that the quantization noise is also reduced by the factor of the divider step reduction. When four phases are used, a divider step size ΔN of 0.25 is attained. This brings about a reduction in the interference swing by the factor 4, which corresponds to a spectral reduction in the phase noise of 12 dB.

The two least significant bits C1, C0 of the ΣΔ modulator are used, in one example, to actuate the multiplexer via control unit 10. If these two input bits comprise the word 01, then division is by 0.25 by advancing one input phase within a total divider cycle 1:$f_{div}$.

This state, in which the input phase is shifted through 90° and the output phase produces a step size ΔN of 0.25, is denoted by a) in FIG. 2. If the input bits C1, C0 are equal to the word 10, then division is by 0.5 by advancing two phases, that is to say 180°, within a total divider cycle. This is denoted by the letter b) in FIG. 2. Accordingly, when the two LSBs C1, C0=11, the result is a divider step size ΔN equal to 0.75, which is shown in FIG. 2 for the input and output phases with the letter c) in the respective bottom row of the illustration.

The present invention provides for a transmitter design with a high level of spectral purity which can be used to produce frequency-modulated and/or phase-modulated signals or alternatively be used as a frequency synthesizer. In one embodiment of the invention, the full modulation bandwidth is transmitted via the phase locked loop. To allow this large bandwidth, the quantization noise in the ΣΔ modulator is reduced as explained. This is possible by virtue of the VCO operating at twice the output frequency $f_{out}$ and a subsequent division-by-two frequency divider producing a total of four signals phase-shifted in steps of 90° relative to one another.

The phases provided as a result can be used to attain a resolution for the divider steps of ΔN=0.25, so that in comparison with a conventional architecture with the step size ΔN=1 the phase noise, caused by changing over the multimodulus divider, can be reduced by 12 dB. In this context, the invention advantageously avoids the requirement for accurate alignment between analog and digital parts of the circuit, as would arise with two-point modulation, for example.

FIG. 3 shows an exemplary application of the described principle based on the invention, in which the transmission design is developed and produced such that it can be used both for radio transmitters based on the DECT (Digital Enhanced Cordless Telecommunication) standard in a frequency range between 1880 MHz and 1900 MHz and for WDCT, which operates in the ISM (Industrial Scientific and Medical) band between 2.4 and 2.48 GHz.

Since the circuit from FIG. 3 largely corresponds to that from FIG. 1 in terms of design and advantageous mode of operation, this description is not repeated in this respect.

In the circuit in FIG. 3, the multimodulus divider comprises a divider chain containing five series-connected two/three frequency divider stages which can each be changed over between the division values 2 and 3. This results in a range for the adjustable division values from N equals 32 to N equals 63.

The ΣΔ modulator 9 is connected to the multimodulus divider 8 via five control lines C2 to C6, and each of these control lines actuates a respective frequency divider stage. Two additional control lines, namely the two least significant bits C0 and C1, actuate the multiplexer 7 via the controller 10. The input side of the ΣΔ modulator 9 has a summing element 11 which has two inputs. A first input can be supplied with a channel word, and a second input can be supplied with digital modulation data. In this case, the channel word is used to set the desired transmission channel.

The VCO 4 has a band changeover section in the present case and produces frequencies in the band between 3.8 GHz and 4.9 GHz, in each case twice the frequencies of the frequency bands of DECT and ISM band. These are approximately 1.9 GHz and approximately 2.45 GHz, respectively. If not only the division ratios N of 32 to 63 for the multimodulus divider 8, but additionally the step sizes ΔN of 0.25 which are possible with the frequency divider 5 and the multiplexer 7 are taken into account, then the overall result for the ΣΔ fractional N PLL described is that division values of 32 to 63.75 can be set with a step size of 0.25.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A phase locked loop with a modulator, comprising:
   a forward path, comprising:
      a phase comparator comprising a first input configured to receive a signal at a reference frequency, and a second input;
      a controlled oscillator comprising a control input coupled to an output of the phase comparator; and
      a frequency divider comprising a signal input connected to an output of the controlled oscillator, and an output that forms a signal output for the phase locked loop, and configured to provide a signal thereat at an output frequency, and comprising at least three further outputs, each configured to output respective signals at the output frequency that are phase-shifted with respect to the signal output;
   a feedback path, comprising:
      a multiplexer comprising a plurality of inputs each connected to a respective output of the frequency divider, an output, and at least one control input; and
      a multimodulus divider comprising an input connected to the output of the multiplexer, an output connected to the second input of the phase comparator, and comprising at least one control input for preselecting the division ratio associated therewith; and
   a control unit coupled to the control inputs of the multiplexer and the multimodulus divider, the control unit comprising a sigma-delta modulator.

2. The phase locked loop of claim 1, wherein the frequency divider comprises a divide-by-two frequency divider such that the frequency of the signal provided at the output of the controlled oscillator corresponds to twice the output frequency.

3. The phase locked loop of claim 1, wherein the frequency divider comprises four outputs, and is configured to generate four signals at the output frequency that are phase-shifted relative to one another in steps of 90 degrees.

4. The phase locked loop of claim 1, further comprising a control element configured to couple the control input of the multiplexer to the sigma-delta modulator, and comprising a control input configured to receive at least two control bits that are the least significant bits provided by the sigma-delta modulator.

5. The phase locked loop of claim 1, further comprising a series circuit comprising a charge pump circuit and a loop filter coupled between the phase comparator and the control input of the controlled oscillator.

6. The phase locked loop of claim 1, wherein the multimodulus divider comprises a series circuit containing a plurality of ⅔ frequency divider stages that allow changeover between a frequency division ratio of two and a frequency division ratio of three.

7. A phase locked loop, comprising:
   a phase comparator configured to compare a reference frequency signal with a divided feedback signal, and generate a control signal in response thereto;
   a controlled oscillator configured to generate a controlled frequency signal as a function of the control signal;
   a programmable frequency divider circuit configured to receive a feedback signal associated with the controlled frequency signal and generate the divided feedback signal by dividing the feedback signal by a value that is based on a division control signal coupled thereto; and
   a sigma-delta modulator configured to generate the division control signal based on modulation data supplied thereto; and
   a frequency divider comprising a signal input connected to the output of the controlled oscillator, and an output that forms a signal output for the phase locked loop, and configured to provide a signal thereat at an output frequency, and comprising at least three further outputs, each configured to output respective signals at the output frequency that are phase-shifted with respect to the signal output,
   wherein a selection of one of the four phase shifted signals as the feedback signal is dictated by the division control signal.

8. The phase locked loop of claim 7, further comprising:
a multiplexer configured to receive the plurality of divided down controlled frequency signals and selectively pass one of the signals to the programmable frequency divider circuit based on a selection signal provided by the sigma-delta converter.

9. The phase locked loop of claim 8, wherein the sigma-delta modulator is further configured to generate the selection signal provided to the multiplexer based on the division control signal.

10. The phase locked loop of claim 9, wherein the plurality of divided down control frequency signals are consecutively ninety degrees out of phase with one another.

11. The phase locked loop of claim 7, further comprising a series circuit comprising a charge pump and a loop filter configured to generate a tuning signal for the controlled oscillator based on the control signal from the phase comparator.

* * * * *